(12) United States Patent
Yoo

(10) Patent No.: US 6,207,932 B1
(45) Date of Patent: Mar. 27, 2001

(54) HEATER BLOCK FOR HEATING WAFER

(75) Inventor: Jin-Seock Yoo, Chungcheongbuk-Do (KR)

(73) Assignee: Hyundai Electronics Industries, Co., Ltd., Kyoungki-Do (KR)

(*) Notice: Subject to any disclaimer, the term of this patent is extended or adjusted under 35 U.S.C. 154(b) by 0 days.

(21) Appl. No.: 09/222,928

(22) Filed: Dec. 30, 1998

(30) Foreign Application Priority Data

Dec. 30, 1997 (KR) .................................................. 97-78761

(51) Int. Cl.⁷ .............................. H05B 3/68; C23C 16/00
(52) U.S. Cl. ........................................ 219/444.1; 118/725
(58) Field of Search ........................... 219/443.1, 444.1, 219/462.1, 538, 539; 118/723 VE, 725, 726, 727, 620, 621; 427/255.1, 255.2

(56) References Cited

U.S. PATENT DOCUMENTS

| | | | |
|---|---|---|---|
| 5,059,770 | * 10/1991 | Mahawili | 219/444.1 |
| 5,294,778 | * 3/1994 | Carmen et al. | 219/444.1 |
| 5,854,468 | * 12/1998 | Muka | 219/444.1 |

* cited by examiner

*Primary Examiner*—Sam Paik

(57) ABSTRACT

A heater block for heating a wafer comprising a body member; a wafer support disposed on the body member, the wafer support containing a plurality of troughs which extend along the surface thereof; a plurality of heated elements disposed under the wafer support in the body wherein the heat generated from each of the heated elements is transferred to the wafer support; a gas line connected to the wafer support for supplying gas to the plurality of troughs; means for supplying heat to the heated elements; and a controller connected to the heated elements for controlling the temperature of the heated elements.

9 Claims, 6 Drawing Sheets

HEATER BLOCK FOR HEATING WAFER

BACKGROUND OF THE INVENTION

1. Field of the Invention

The present invention relates to a heater block for heating a wafer, and more particularly, to a heater block which provides a wafer, disposed in a process chamber for PVD (physical vapor deposition), with the proper temperature enviromnent in a thermal process by supplying the wafer with uniform heat.

2. Discussion of the Related Art

A process for fabricating a semiconductor device is accompanied with a plurality of steps requiring high temperature for effecting oxidation, deposition, diffusion and the like.

The heating means for these thermal processes are set up in the processing chamber where the PVD process, for example, is carried out. Thus, heat is transferred to a wafer by transforming electrical energy into thermal energy in the use of a heating device such as a hot-wire. FIG. 1 shows a plan view of a heater block according to the prior art, and FIG. 2 shows a cross-sectional view taken along line I–I' of FIG. 1.

As shown in FIG. 1 and FIG. 2, the heater block comprises a body 100, a bellows 116, a power supply 103, a gas line 108, a controller 101 for checking the temperature and a clamp ring 112. The body 100 includes a heated element 106 wrapped with a hot wire 104 and a wafer support 102 for conveying the heat generated from the heated element 106 to the wafer support 102, wherein the wafer support 102 is located on the upper part of the body 100. The bellows 116 drives the body 100 in the upward and downward direction to position the body in a suitable location. The power supply 103 electrically connected to the hot-wire 104 selectively applies or cuts off electricity to the hot-wire 104 by turning the power on or off. The controller 101 monitors and controls the temperature of the wafer support 102. The clamp ring 112 is utilized to fix the wafer 110 to the wafer support 102.

The heater block according to a prior art is mounted on the lower part of the process chamber not shown in the drawings, and a gas supply pipe is installed at the upper part of the process chamber with an exhaust pipe being located at the lower part of the process chamber. Accordingly, while the processing gas is supplied to the inside of the processing chamber from the gas supply pipe, thermal processing such as deposition, diffusion and the like on the wafer heated by the heater block proceeds in accordance with the prior art. By-products from the process are exhausted through the exhaust pipe. The inside of the process chamber is constantly maintained at a pressure of 3 to 8 mTorr during the thermal process.

The procedure of heating the wafer with a heater block according to the prior art is a follows. To the heated element 106 is transferred the heat which is generated from the hot-wire 104 coruected to a power source when the power supply 103 is turned to the "on" position. The heated element 106 is made of a ceramic material and belongs to the body 100 under the wafer support 102 and is surrounded spirally by the hot-wire 104.

The heat transmitted from the heated element 106 preheats the wafer support 102 controlled by the controller 101 for maintaining the proper temperature in the thermal process. Once the wafer support is preheated to the proper temperature, a wafer 110 is mounted on the wafer support 102 by a transporting means, such as a robot arm, etc. Then the wafer support 102 is moved to a suitable level by the bellows 116 connected to the body 100.

Gas is supplied to the reverse face of the wafer 110 on which no device is being formed, wherein the gas line 108 is tunneled through the wafer support 102 and is connected to the discharge hole 118 formed in the wafer support 102 for carrying gas from the center to the ends of the wafer through the hole 118. The gas supplied through the gas line 108 is identical to the process gas supplied from the gas supply pipe formed in the process chamber, thereby heating the reverse face of the wafer as well as the heated element 106. This gas supply also contributes to the thermal process of diffusion, deposition, etc. on the wafer 110 together with the process gas which is supplied through the gas supply pipe. The gas supplied through the gas line 108 and the gas supply pipe is an inert gas, e.g., Ar. The gas introduced through the gas line 108 is maintained at a constant pressure as it contracts the reverse face of the wafer. The wafer 110 is fixed to the wafer support 102 by means of a clamp ring which clamps the top-side of the wafer to the support 102, while the pressurized gas is supplied during the thermal process.

As only one controller for monitoring the temperature is installed for the heated clement for heating the wafer support of the prior art heater block, a temperature difference may occur due to the impossibility of controlling each section of the wafer support from the center to the extremities, particularly if the hot-wire wrapped along the heated clement becomes broken or is weakened in its function.

Accordingly, there is a problem that an uneven distribution of temperature along the wafer is caused during the thermal process by the inability of the controller to control the temperature difference throughout the entire wafer. Moreover, the device is contaminated at the contact area between the wafer and the clamp ring due to particles that attach to or are introduced by the clamp ring itself.

SUMMARY OF THE INVENTION

The present invention is directed to a heater block that substantially obviates one or more of the limitations and disadvantages of the related art. Accordingly, an object of the present invention is to provide a heater block which conducts heat uniformly within the wafer during a typical thermal process.

Another object of the present invention is to provide a heater block which minimizes particles which appear during a thermal process. Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

To achieve these and other advantages and in accordance with the purposes of the present invention, as embodied and broadly described, a heater block for heating a wafer is provided which comprises a body and a wafer support disposed on said body, wherein a plurality of troughs are disposed in the surface of the wafer support, and a plurality of heated elements are positioned under the wafer support and in the body, said heated elements being wrapped with hot-wires so that the heat generated from each of the heated objects is conveyed to the wafer support. A gas line is connected to the wafer support so that the gas line can supply gas to the troughs. A power supply is electrically conlected to each of the hot-wires, and a controller for monitoring the temperature is connected to each of the heated elements, respectively, whereby the controllers control the temperature in each of the heated elements.

It is to be understood that both the foregoing description and the following detailed description are exemplary and explanatory and are intended to provide a further explanation of the present invention.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Reference will now be made in detail to the preferred embodiments of the present invention, examples of which are illustrated in the accompanying drawings.

Figure 1:
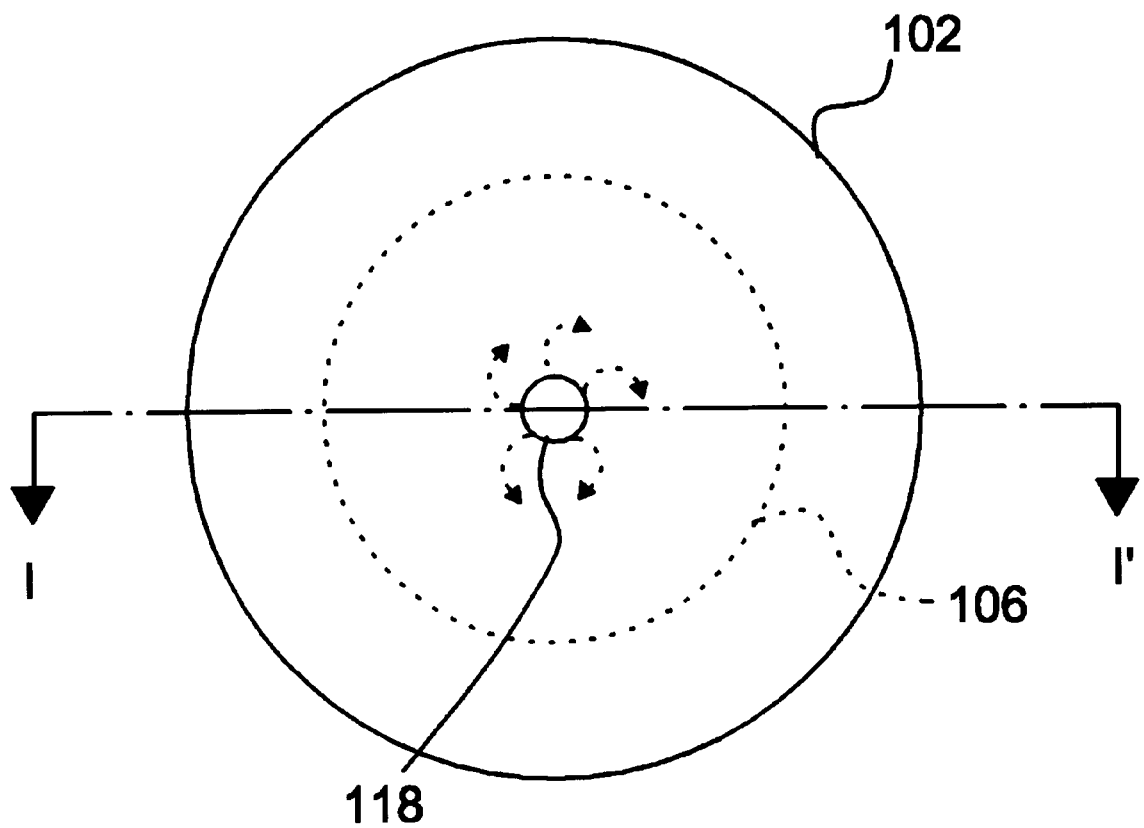
FIG. 1 is a plan figure of a heater block according to the prior art.
Figure 2:
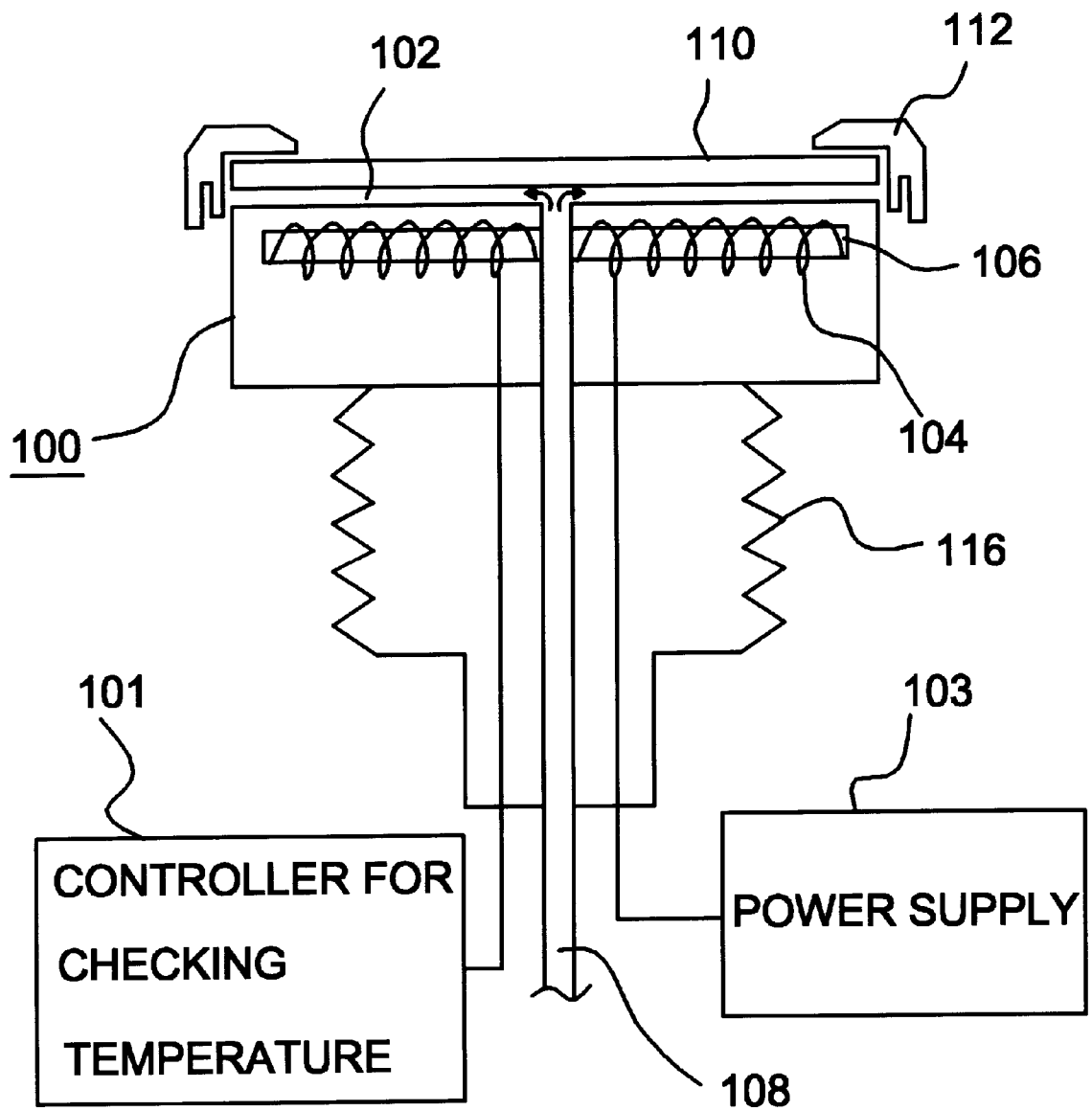
FIG. 2 is a cross-sectional view taken along line I–I' of FIG. 1.
Figure 3:
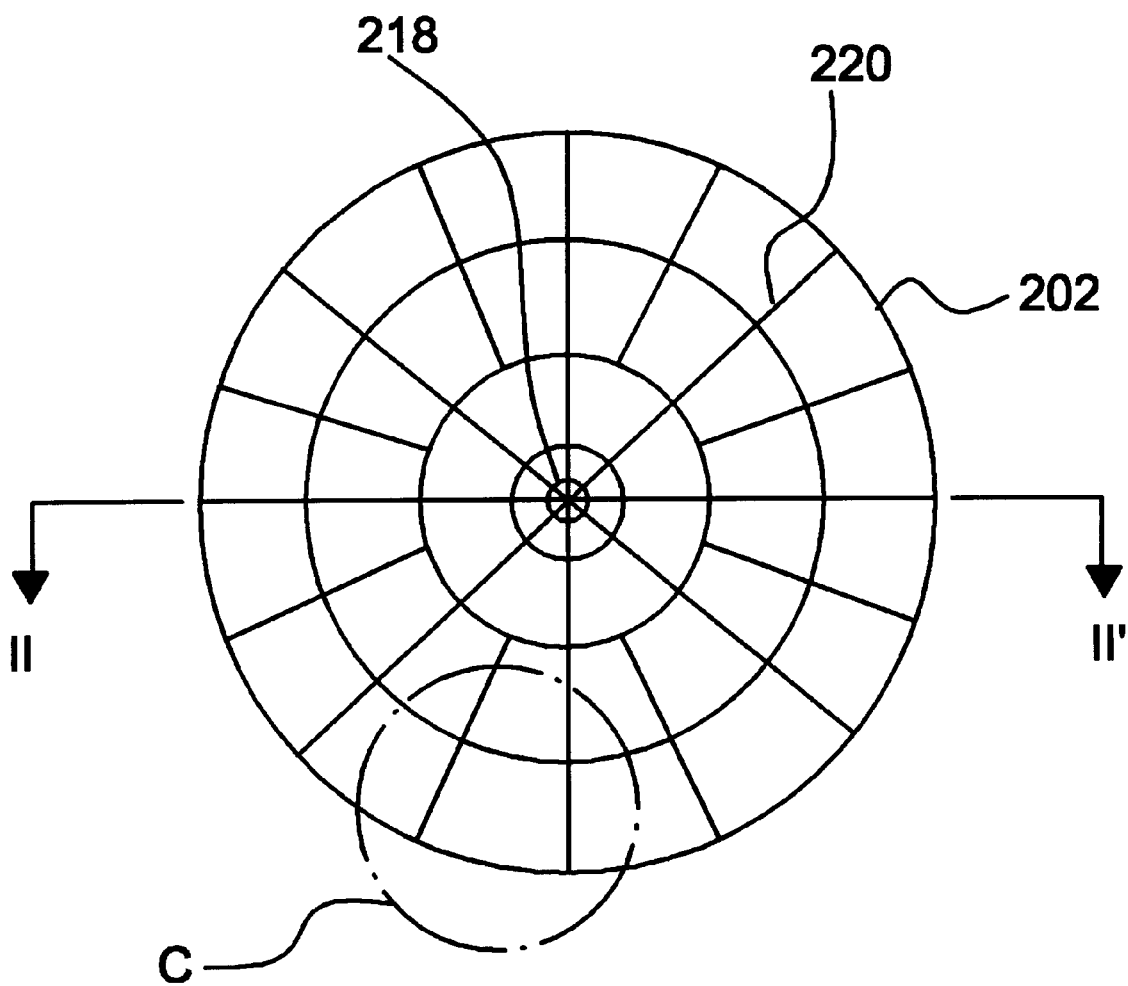
FIG. 3 is a plan figure of a heater block according to the present invention.
Figure 4:
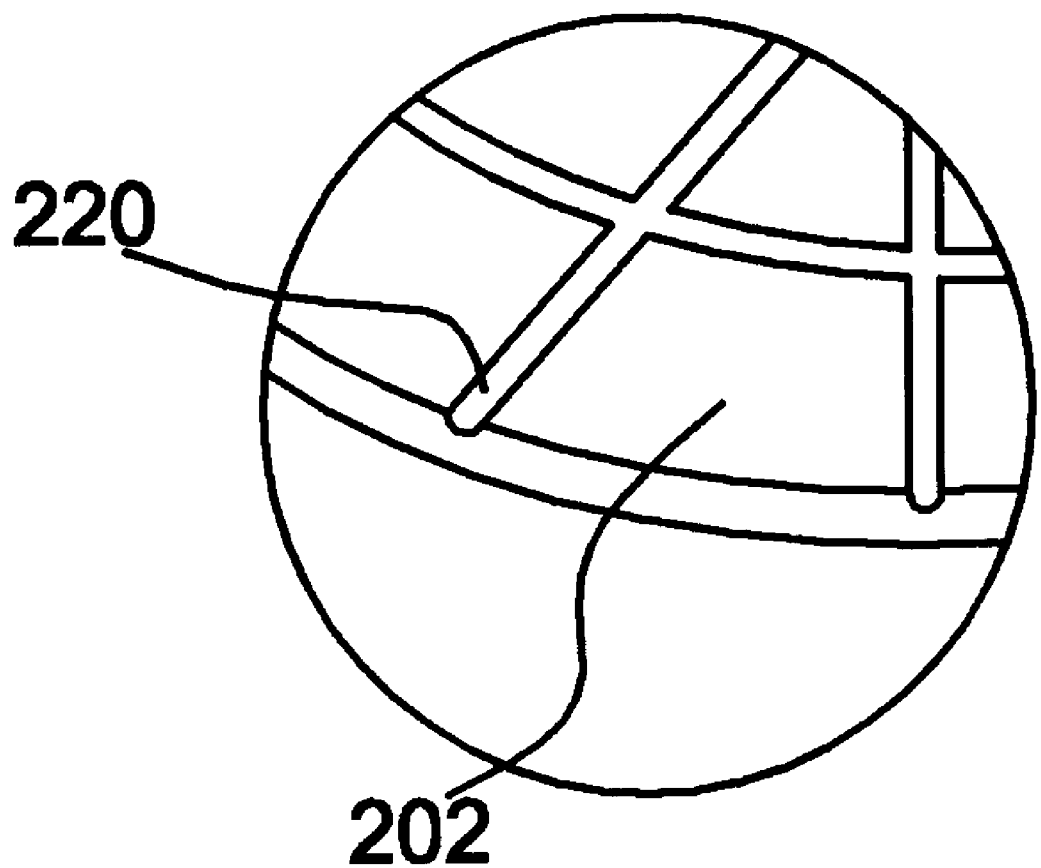
FIG. 4 is an enlarged view of part C in FIG. 3.
Figure 5:
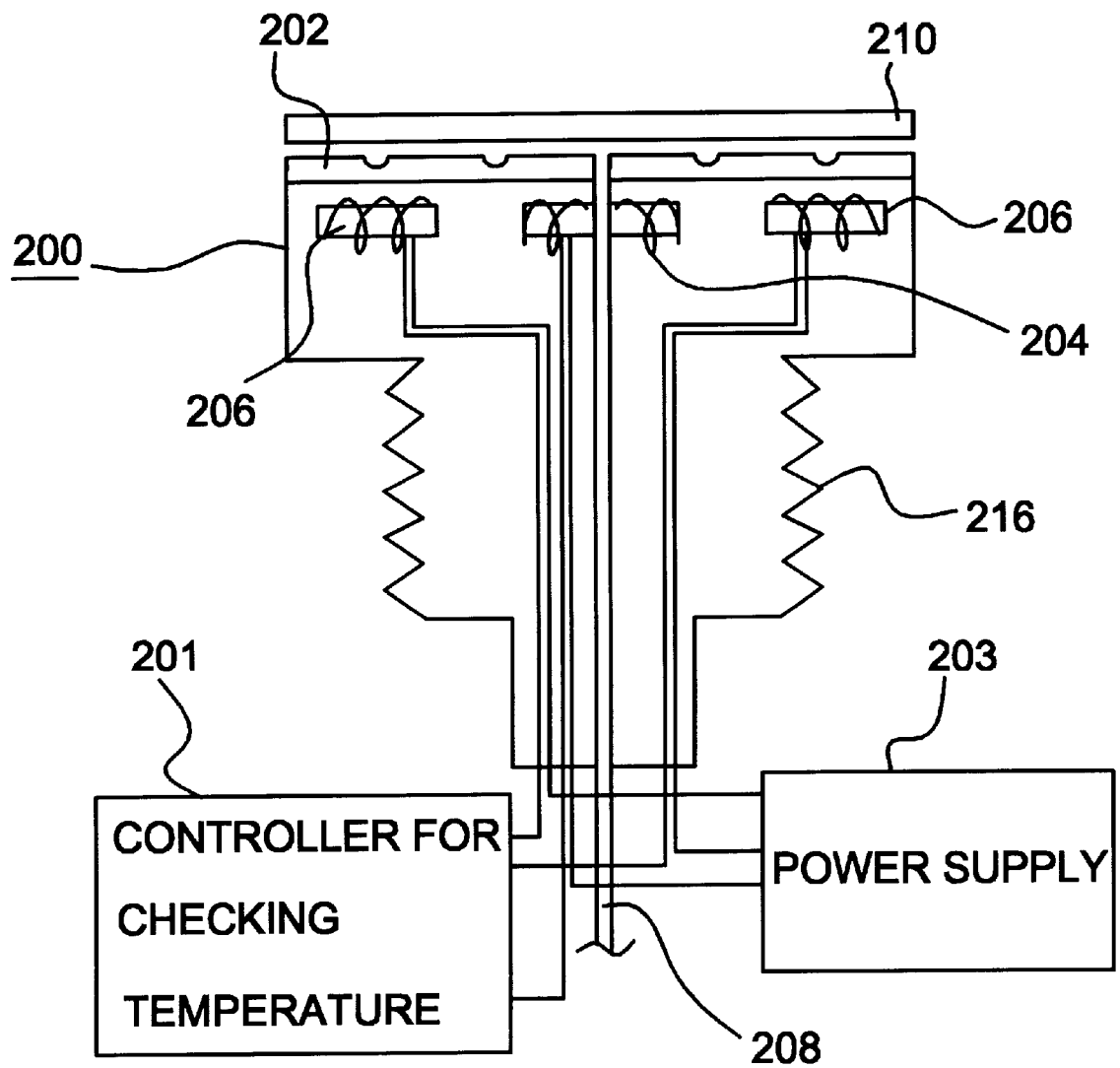
FIG. 5 is a cross-sectional view taken along line II–II' of FIG. 3.
Figure 6:
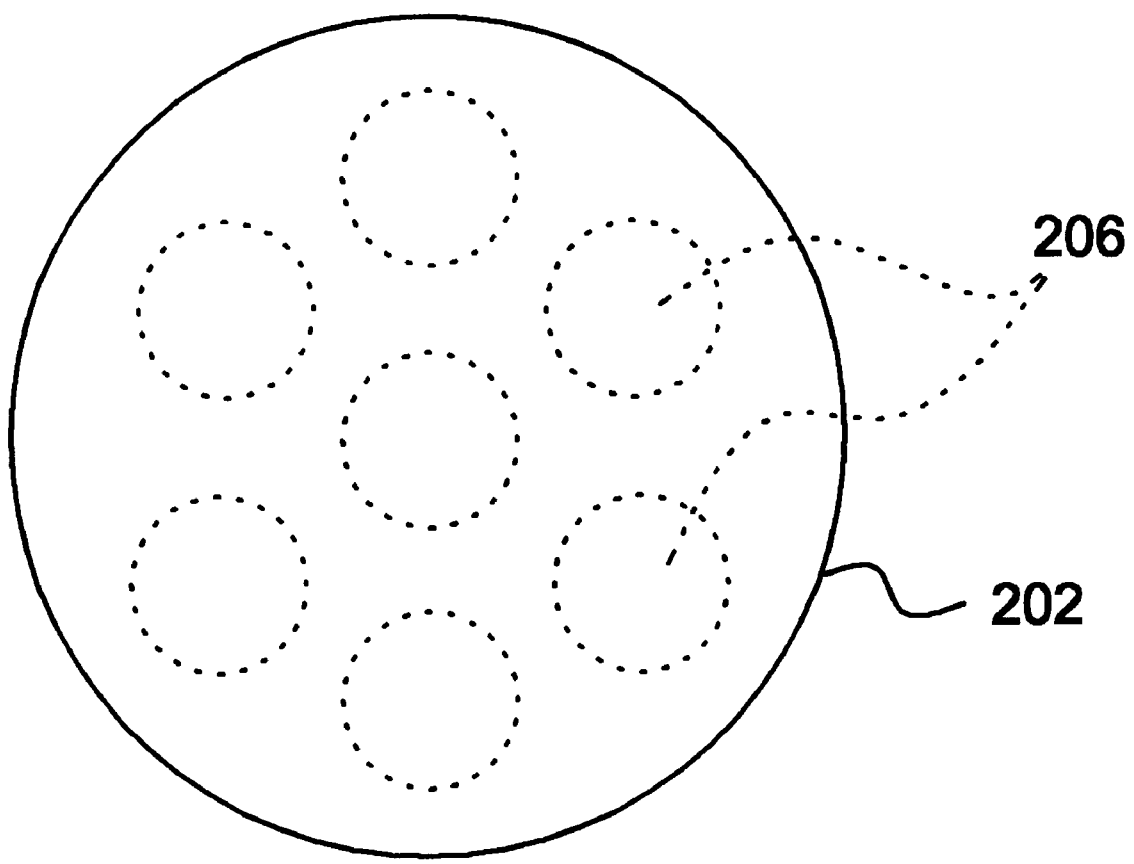
FIG. 6 shows a plan view of a heater block according to the present invention, particularly featuring each heated element which is distributed evenly in the body of the device.

FIG. 3 shows a plan view of a heater block according to the present invention; FIG. 4 shows an enlarged view of part C of FIG. 3 featuring a plurality of troughs formed on the surface of the wafer support 202;

FIG. 5 shows a cross-sectional view taken along line II–II' of FIG. 3, and FIG. 6 shows a plan view of a heater block according to the present invention, particularly featuring each heated element 206 which is distributed evenly in its location on the wafer support 202.

Referring to FIGS. 3–6, the heater block according to the present invention comprises a body 200, a bellows 216, a gas line 208, a power supply 203 and a temperature controller 201. The wafer support located at the top of body 200 has a plurality of troughs 220 disposed in various directions at the top face thereof. Also, a plurality of the heated elements 206, each wvrapped with a hot-wire 204, are provided in the body 200. The heat generated from the heated elements 206 is conducted to the wafer support 202.

The bellows 216 which moves the body 200 up and down is used to adjust the wafer support 202 upwardly to a suitable level. The gas line 208 connected with the wafer support 202 supplies gas through a plurality of troughs 220. The power supply 203 is connected to each hot-wire 204 for supplying or cutting off electricity to the hot-wire 204 by turning the power source on or off.

The temperature controller 201 which is electrically connected to the plurality of the heated elements 206 comprises a plurality of controllers for adjusting each temperature of the heated elements 206.

The heater block according to the present invention is installed in the lower part of a process chamber and helps the thermal process to proceed by heating the wafer. The pressure of the process chamber is maintained at 3–8 mTorr during the thermal process.

The procedures of heating the wafer with the heater block according to the present invention are as follows.

When the power supply 203 is turned on, heat generated from each hot-wire 204 connected to the power source is conducted to the plurality of heated elements 206. The heated elements 206, forming a plurality of zones that provide even distribution, as shown in FIGS. 5 and 6, are positioned under the wafer support 202 and are helically wrapped with the hot-wires 204.

As is shown in FIG. 5, each hot-wire 204, electrically connected to the power supply 203, is controlled by turning the power source either on or off. The plurality of heated elements 206 are controlled to maintain a certain temperature by controllers which are electrically connected to respective heated elements. Each controller is regulated by the temperature controller 201. Heat from the plurality of heated elements 206 preheat the entire wafer support 202. The heated elements 206 can be made of a ceramic material.

After the wafer support 202 is preheated to a proper temperature, the wafer 210 is mounted on the wafer support 202 by a transporting device such as a robot arm or the like. Once the wafer support 202 is driven upwardly to a suitable level by the bellows 216 connected to the body 200, gas is supplied to the reverse face of the wafer 210, where no device is formed, via the gas line 208. A hole 218 connected to the gas line 208 is formed on the surface of the wafer support 202 and a plurality of troughs 220 are formed around the hole 218 extending in various directions. The gas from the gas line 208 is the same as that from the gas supply pipe installed in the process chamber and is a source which helps to make the thermal process proceed.

The gas supplied from the gas line 208 as well as the heated elements 206 heats the reverse face of the wafer 10, and this gas as well as the process gas supplied from the gas supply pipe helps the thermal processes such a diffusion, deposition, etc. proceed. The diffusion progresses toward the upper direction of the process chamber. The gas supplied from the gas line 208 and the gas supply pipe in the process chamber is an inert or inactive gas such as Ar.

The process for supplying the gas via the gas line 208 to heat the wafer is as follows.

First, the gas supplied via the gas line 208 with a constant pressure comes out of the body 200 through the hole 218 on the wafer support 202. Secondly, the gas flows in a variety of directions along the plurality of troughs 220, heating the reverse face of the wafer 210. The troughs 220 have a concave configuration with a depth of 1 mm from the surface of the wafer support 202 and define a pattern which radiates in all directions along the wafer support 202.

In the present situation, the wafer 210 has no chance of separating from the wafer support 202 due to the dispersion of the gas pressure on the wafer support 202 as the gas diffuses in the lateral directions between the wafer support 202 and the wafer 210.

Accordingly, no additional device, such as a clamp ring, etc. is required to fix the wafer to the wafer support and the gas supply pipe for supplying the gas chamber with additional process gas is not necessary since the supply of the gas from the gas line 208 is possible due to the dispersed pressure and the gas coming out of the body.

As is explained above, the heated block according to the present invention has a hole on the wafer support connected to the gas line and a plurality of troughs are formed around the hole like the spokes of a wheel, dispersing the pressure of the gas supplied via the gas line and preventing the wafer from separating from the wafer support without requiring an extra clamp ring. Moreover, as it is possible to control the temperature of each sector of the wafer support (in other words, to achieve angularly anisotropic energization of the heated elements) by providing a plurality of evenly distributed heated elements corresponding to the entire surface of the wafer support and providing temperature controllers for each heated element for heating the water in an even manner.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heater block for heating a wafer, the heater block comprising:
    a body member;
    a wafer support disposed on said body member;
    a plurality of heating elements disposed under the wafer support and in said body member,
        wherein, for a reference circle visualized from a top view of said body member and centered upon a reference point of said body member, individual ones of said heating elements are located entirely within sectors of said reference circle, and
        wherein the heat generated from each of said heating elements is transferred to said wafer support;
    a power supply to energize said heating elements; and
    a controller connected to said heating elements for non-uniformly controlling the energy supplied to said heating elements so as to produce angularly anisotropic heating of said heating elements.

2. The heater block for heating the water according to claim 1 wherein the heating elements are units wrapped with hot wires and said power supply is electrically connected to said hot wires.

3. The heater block for heating the wafer according to claim 2, wherein said wafer support has a plurality of troughs that extend along the surface thereof, the heater block further comprising a gas line connected to said wafer support to supply gas to said plurality of troughs.

4. The heater block for heating the wafer according to claim 1, wherein said troughs have a depth of 1 mm from the surface of the wafer support.

5. The heater block for heating the wafer according to claim 1, wherein said gas is Ar.

6. The heater block for heating the wafer according to claim 1, wherein said heating elements are evenly distributed along the surface of the wafer support.

7. The heater block for heating the wafer according to claim 1, wherein the heating elements are made of a ceramic material.

8. The heater block for heating the wafer according to claim 1, further comprising a central heating element located so as to be substantially centered upon said reference point of said body member and to partially extend into each of said sectors.

9. The heater block for heating the wafer according to claim 1, wherein said heating elements represent circular areas within said sectors, respectively.

* * * * *